(12) United States Patent
Matsumoto et al.

(10) Patent No.: US 9,276,581 B2
(45) Date of Patent: Mar. 1, 2016

(54) NONVOLATILE PROGRAMMABLE LOGIC SWITCH

(71) Applicant: KABUSHIKI KAISHA TOSHIBA, Minato-ku, Tokyo (JP)

(72) Inventors: Mari Matsumoto, Kanagawa (JP); Kosuke Tatsumura, Kanagawa (JP); Shinichi Yasuda, Tokyo (JP); Koichiro Zaitsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/624,961

(22) Filed: Feb. 18, 2015

(65) Prior Publication Data

US 2015/0244373 A1 Aug. 27, 2015

(30) Foreign Application Priority Data

Feb. 21, 2014 (JP) ................... 2014-031930

(51) Int. Cl.
*H03K 19/173* (2006.01)
*H03K 19/0185* (2006.01)
*H03K 19/177* (2006.01)

(52) U.S. Cl.
CPC .... *H03K 19/1735* (2013.01); *H03K 19/018585* (2013.01); *H03K 19/1776* (2013.01)

(58) Field of Classification Search
CPC .............. G11C 16/10; G11C 16/0483; G11C 11/5642; G11C 16/02; G11C 16/3454; G11C 16/3459; G11C 16/24; G11C 11/5621; G11C 11/5628; G11C 11/5635; G11C 16/3445; G11C 2211/5621; G11C 2211/5641; G11C 2211/5642; G11C 2211/5643; G11C 5/145; G11C 7/1006; G11C 16/0475; G11C 16/0466; H03K 19/17736; H03K 19/1778; H03K 19/17728; H03K 19/17744; H03K 19/1776; H03K 19/1736; H03K 19/17748
See application file for complete search history.

(56) References Cited

U.S. PATENT DOCUMENTS

| | | | |
|---|---|---|---|
| 5,537,056 A | 7/1996 | McCollum | |
| 6,002,610 A | 12/1999 | Cong et al. | |
| 6,667,902 B2 | 12/2003 | Peng | |
| 8,432,186 B1 | 4/2013 | Zaitsu et al. | |
| 2002/0190749 A1* | 12/2002 | Sun | G11C 16/0475 326/37 |
| 2013/0076392 A1 | 3/2013 | Zaitsu et al. | |
| 2013/0215670 A1* | 8/2013 | Oda | G11C 16/0441 365/154 |
| 2013/0241596 A1* | 9/2013 | Matsumoto | H03K 19/1776 326/44 |

(Continued)

FOREIGN PATENT DOCUMENTS

| | | |
|---|---|---|
| JP | 2013-70256 | 4/2013 |
| JP | 2013-165466 | 8/2013 |
| JP | 2013-171593 | 9/2013 |

*Primary Examiner* — Jany Richardson
(74) *Attorney, Agent, or Firm* — Finnegan, Henderson, Farabow, Garrett & Dunner, L.L.P.

(57) ABSTRACT

A nonvolatile programmable logic switch of an embodiment includes: a cell including: a first memory including a first terminal connected to a first wiring line, and a second terminal; a second memory including a third terminal connected to a second wiring line, and a fourth terminal connected to the second terminal of the first memory; a first transistor, of which one of a source and a drain is connected to the second and fourth terminals, the other of the source and the drain is connected to a third wiring line, and a gate is connected to a fourth wiring line; and a second transistor, of which one of a source and a drain is connected to the second and fourth terminals, the other of the source and the drain is connected to a gate of a pass transistor, and a gate is connected to a fifth wiring line.

18 Claims, 12 Drawing Sheets

(56) References Cited

U.S. PATENT DOCUMENTS

2013/0307054 A1* 11/2013 Yasuda .............. H01L 29/7881
257/326

2014/0035619 A1* 2/2014 Zaitsu .............. H03K 19/17764
326/41

2015/0262624 A1* 9/2015 Zaitsu ...................... G11C 5/06
365/72

* cited by examiner

NONVOLATILE PROGRAMMABLE LOGIC SWITCH

CROSS REFERENCE TO RELATED APPLICATIONS

This application is based upon and claims the benefit of priority from prior Japanese Patent Application No. 2014-031930 filed on Feb. 21, 2014 in Japan, the entire contents of which are incorporated herein by reference.

FIELD

Embodiments described herein relate generally to nonvolatile programmable logic switches.

BACKGROUND

Programmable logic switches are used in devices requiring reconfiguration of logical operation circuits and wiring boards, such as field programmable gate arrays (FPGAs), and include logic switches and memories. A programmable logic switch turns on and off its logic switches based on data stored in its memories. Volatile memories such as static random access memories (SRAMs) have conventionally been used as the aforementioned memories. However, when power is turned off, data stored in each volatile memory is erased. As a result, data should be rewritten to the memory when power is turned on next time.

Another known method is to use nonvolatile flash memories as the memories of programmable logic switches. In an example of such a programmable logic switch, one cell of the memory includes two nonvolatile memory elements and one switching transistor (pass transistor). Flash memory elements can be used as the memory elements. A power supply voltage or a voltage of 0 V is inputted to the gate of the switching transistor via one of the two flash memory elements. Employing such a structure in the memory reduces the area of the programmable logic switch as compared with a case where SRAMs are used as the memory elements.

Another known method is to use anti-fuse elements in an FPGA. In this method, the resistance of a specific anti-fuse element is changed to a low value to electrically connect a plurality of wiring lines to establish various circuits.

Since whether the wiring lines are connected or disconnected is irreversible in an FPGA employing this method, there is no fear of unexpected change in circuit information. This makes it possible to use this FPGA under a circumstance in which FPGAs including flash memories are difficult to be used. The disadvantage of this FPGA, however, is that the wiring line that is once connected cannot be disconnected again.

DETAILED DESCRIPTION

A nonvolatile programmable logic switch according to an embodiment includes: a memory cell; and a pass transistor, the memory cell including: a nonvolatile first memory element including a first terminal connected to a first wiring line, and a second terminal; a nonvolatile second memory element including a third terminal connected to a second wiring line, and a fourth terminal connected to the second terminal of the first memory element; a first transistor, of which one of a source and a drain is connected to the second terminal and the fourth terminal, the other of the source and the drain is connected to a third wiring line, and a gate is connected to a fourth wiring line; and a second transistor, of which one of a source and a drain is connected to the second terminal and the fourth terminal, the other of the source and the drain is connected to a gate of the pass transistor, and a gate is connected to a fifth wiring line.

Embodiments will now be explained with reference to the accompanying drawings.

First Embodiment

Figure 1:
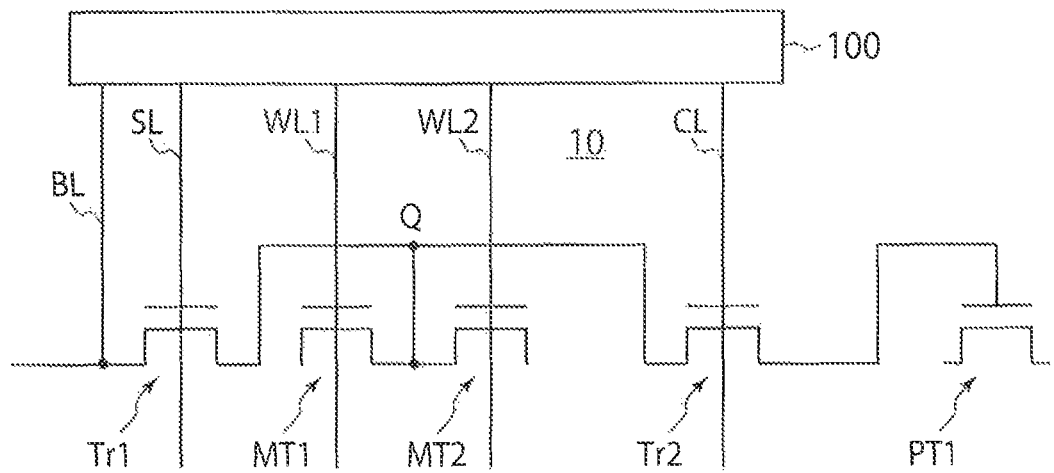
FIG. 1 is a circuit diagram showing a memory cell of a nonvolatile programmable logic switch according to a first embodiment.

A nonvolatile programmable logic switch ("logic switch") according to a first embodiment will be described with reference to FIG. 1. The logic switch according to the first embodiment includes at least one memory cell, at least one pass transistor, and a control circuit 100. FIG. 1 shows the memory cell. The memory cell 10 includes two nonvolatile memory elements ("memory elements") MT1, MT2, and two logic transistors Tr1, Tr2. In the first embodiment and the second embodiment described later, the memory elements MT1, MT2 are MOS transistors, in each of which one of the source and the drain is connected to a node Q, and the gate is connected to one of word lines WL1 and WL2. One of the source and the drain of the logic transistor Tr1 is connected to the node Q, the other is connected to a bit line BL, and the gate is connected to a source line SL. One of the source and the drain of the logic transistor Tr2 is connected to the node Q, the other is connected to the gate of the pass transistor PT1, and the gate is connected to a control line CL.

With the memory cell 10 being configured as described above, the logic switch according to the first embodiment becomes a one-time programmable logic switch having one switch information item.

The other of the source and the drain of each of the memory elements MT1, MT2 is always in a floating state. Therefore, the other of the source and the drain is not needed to connect to any element. The memory elements MT1, MT2 may have the same gate stack structure as the logic transistors Tr1, Tr2, However, the well on which the two memory elements MT1, MT2 are formed is preferably separated from the well on which the two logic transistors Tr1, Tr2 adjacent to these memory elements are formed. The gate stack structure of the memory elements MT1, MT2 may be different from that of the logic transistors Tr1, Tr2, For example, although a logic transistor may be a common MOS transistor, a transistor that may serve as a flash memory having a metal-oxide-nitride-oxide-semiconductor (MONOS) type gate structure, or a transistor in which the gate insulating film is a high-k film can be used as the memory elements MT1, MT2. With such transistors, the same effect as the effect in the case where common MOS transistors are used as memory elements can be obtained by applying a voltage for causing breakdown of the gate insulating film between the gate and the well on which the transistor is formed. The two memory elements MT1, MT2 are used to store one switching information item, but may serve as flash memories if the gate breakdown does not occur. By connecting the memory cells in parallel so that they share a word line WL, a source line SL, and a control line CL, and further share a pass transistor, multiple circuit information items can be dynamically switched.

(Memory Cell Breakdown (Write) Method)

Figure 2:
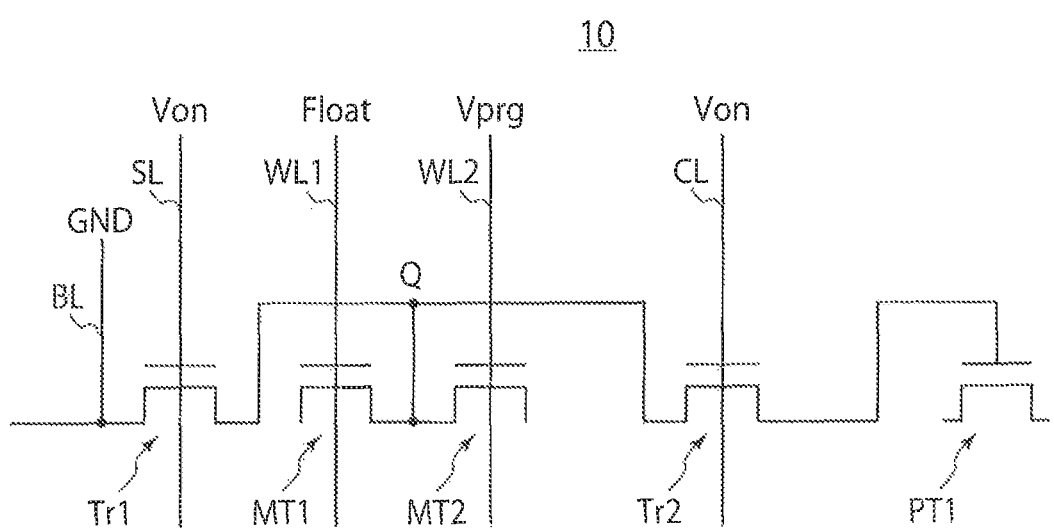
FIG. 2 is an explanatory diagram illustrating an example of method of writing data to the memory cell shown in FIG. 1.

A method of writing data to the memory cell 10 according to the first embodiment will be described with reference to FIG. 2. FIG. 2 shows a case where voltages are applied to cause breakdown of the gate insulating film of one of the two memory elements MT1, MT2 (for example, the memory element MT2). A write voltage Vprg is applied to the gate of the memory element MT2 to be subjected to gate breakdown, and no voltage is applied to the gate of the memory element MT1 not to be subjected to gate breakdown, but to be brought into a floating state. Furthermore, a ground voltage GND is applied to the bit line BL, and a voltage Von for turning on the logic transistor Tr1 is applied to the source line SL connecting to the gate of the logic transistor Tr1. As a result, the ground voltage is applied to the node Q. The write voltage Vprg applied between the gate electrode, to which the write voltage Vprg is applied, and the source electrode, to which the node Q is connected, results in breakdown of the gate insulating film of the memory element MT2. This causes a short circuit between the gate and the source. Voltages applied to the word lines WL1, WL2, the source line SL, the control line CL, and the bit line BL in the write method are controlled by the control circuit 100.

Since the gate of the memory element MT1 in the floating state, no gate breakdown occurs when the ground voltage GND is applied to the source. Thereafter, the voltage Von is applied to the gate of the logic transistor Tr2 for turning it on. If the short circuit between the gate and the source of the memory element MT2 causes a current to flow into the node Q, most of the current flows to the logic transistor Tr1 connected to the ground voltage GND. This prevents the breakdown of the gate insulating film in the pass transistor PT1. If a voltage of VDD or more is applied to the node Q, no current excessing a predetermined value flows since the logic transistor Tr2 has reached a saturation level. The values of the current and the voltage at this time are dependent on the device size.

(Memory Cell Read Method)

Figure 3:
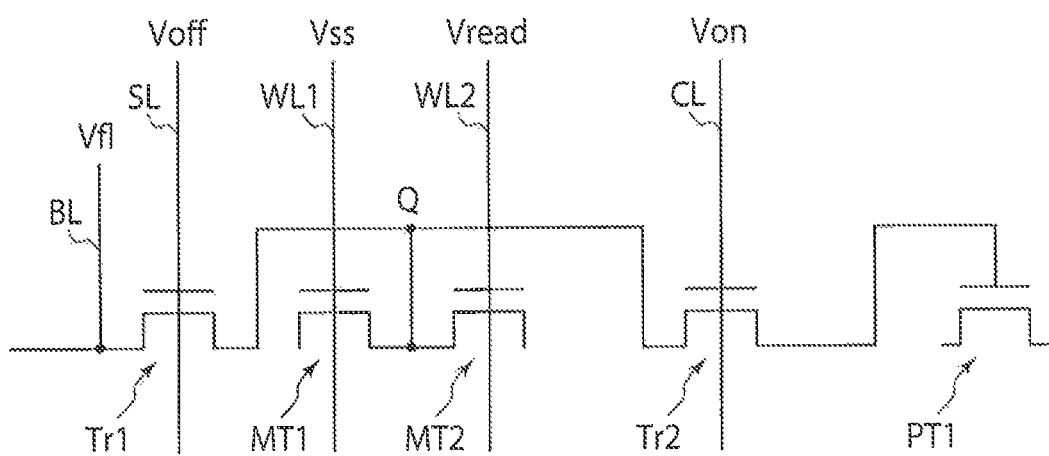
FIG. 3 is an explanatory diagram illustrating an example of method of reading data from the memory cell shown in FIG. 1.

Next, a method of reading data from the memory cell 10 according to the first embodiment will be described with reference to FIG. 3. When data is read from the memory cell 10, one of the memory elements MT1, MT2 is in a write state, and the other is in a no-write state. In FIG. 3, the memory element MT1 is in a no-write state, and the memory element MT2 is in a write state. The write state herein means that the gate and the source are short-circuited, and the no-write state means that the gate and the source are not short-circuited. A read voltage Vread (for example, power supply voltage) is applied to one of the word lines WL1, WL2, for example the word line WL2, and a voltage Vss (for example, ground voltage) is applied to the other. As a result, the read voltage or the ground voltage is applied to the gate of the pass transistor through a path between the gate and the source of one of the memory elements MT1, MT2, in which breakdown of the gate insulating film occurs. Voltages applied to the word lines WL1, WL2, the source line SL, the control line CL, and the bit line BL in the read method are controlled by the control circuit 100.

Figure 4:
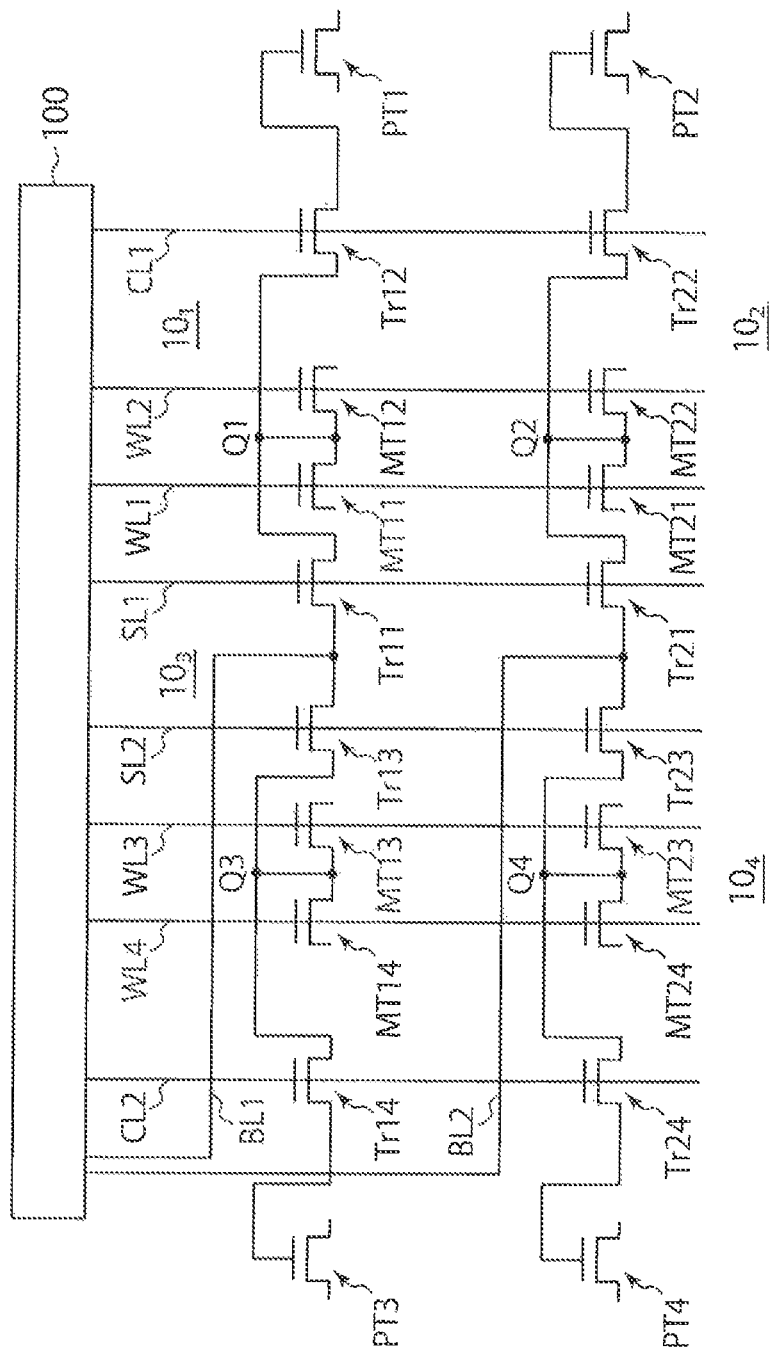
FIG. 4 is a circuit diagram showing a nonvolatile programmable logic switch according to the first embodiment.

FIG. 4 shows a logic switch according to the first embodiment, in which the memory cells 10 shown in FIG. 1 are arranged in an array form. The logic switch shown in FIG. 4 is a single-context logic switch including four memory cells $10_1$, $10_2$, $10_3$, $10_4$, four pass transistors PT1, PT2, PT3, PT4, and a control circuit 100.

The memory cell $10_1$ includes two memory elements MT11, MT12 and two logic transistors Tr11, Tr12. One of the source and the drain of each of the memory elements MT11, MT12 is connected to the node Q1, and the gate is connected to one of word lines WL1, WL2. One of the source and the drain of the logic transistor Tr11 is connected to a node Q1, the other is connected to a bit line BL1, and the gate is connected to a source line SL1. One of the source and the drain of the logic transistor Tr12 is connected to the node Q1, the other is connected to the gate of a pass transistor PT1, and the gate is connected to a control line CL1.

The memory cell $10_2$ includes two memory elements MT21, MT22 and two logic transistors Tr21, Tr22. One of the source and the drain of each of the memory elements MT21, MT22 is connected to a node Q2, and the gate is connected to one of the word lines WL1, WL2. One of the source and the drain of the logic transistor Tr21 is connected to the node Q2, the other is connected to a bit line BL2, and the gate is connected to the source line SL1. One of the source and the drain of the logic transistor Tr22 is connected to the node Q2, the other is connected to the gate of a pass transistor PT2, and the gate is connected to the control line CL1.

The memory cell $10_3$ includes two memory elements MT13, MT14 and two logic transistors Tr13, Tr14. One of the source and the drain of each of the memory elements MT13, MT14 is connected to a node Q3, and the gate is connected to one of word lines WL3, WL4. One of the source and the drain of the logic transistor Tr13 is connected to the node Q3, the other is connected to the bit line BL1, and the gate is connected to a source line SL2. One of the source and the drain of the logic transistor Tr14 is connected to the node Q3, the other is connected to the gate of a pass transistor PT3, and the gate is connected to a control line CL2.

The memory cell $10_4$ includes two memory elements MT23, MT24 and two logic transistors Tr23, Tr24. One of the source and the drain of each of the memory elements MT23, MT24 is connected to a node Q4, and the gate is connected to one of the word lines WL3, WL4. One of the source and the drain of the logic transistor Tr23 is connected to the node Q4, the other is connected to the bit line BL2, and the gate is connected to the source line SL2. One of the source and the drain of the logic transistor Tr24 is connected to the node Q4, the other is connected to the gate of a pass transistor PT4, and the gate is connected to the control line CL2.

(Selective Write Method)

Figure 5:
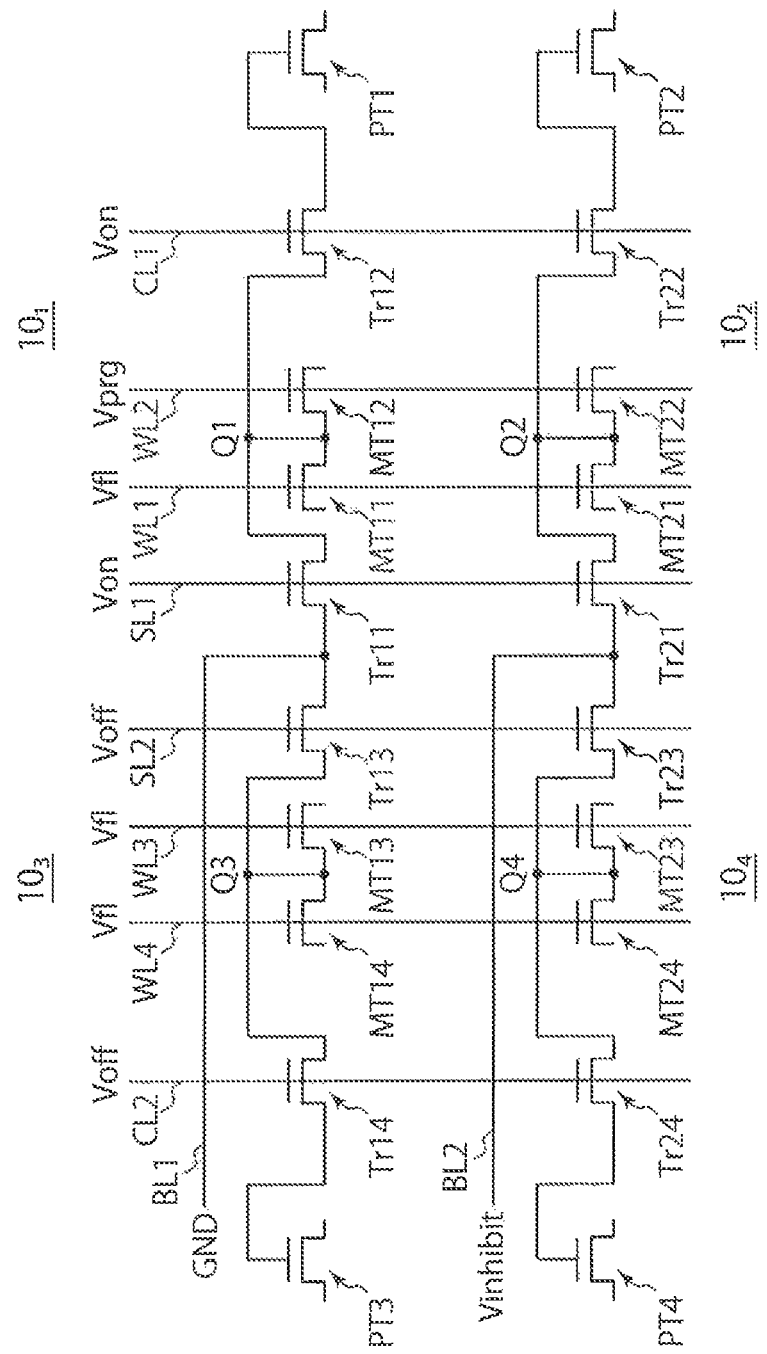
FIG. 5 is an explanatory diagram illustrating an example of selective writing method in the nonvolatile programmable logic switch shown in FIG. 4.

A selective write method of the logic switch shown in FIG. 4 will be described below with reference to FIG. 5. FIG. 5 shows an example of voltage application conditions when data is selectively written to the memory element MT12 of the memory cell $10_1$. The word line WL1 is brought into a floating state, and a write voltage Vprg is applied to the word line WL2. A ground voltage GND is applied to the bit line BL1, and a gate voltage Von is applied to the source line SL1 to turn on the logic transistor Tr11. A voltage (Vinhibit) for preventing short circuit is applied to the bit line BL2 so that no data is written to MT22. The voltage Vinhibit for preventing short circuit has the same polarity as the write voltage Vprg, and is in a range 0<Vinhibit<Vprg, The voltage Vinhibit for preventing short circuit preferably has a value for preventing breakdown of the respective logic transistors, e.g., voltage VDD. The voltage Vinhibit is preferably used in a range where Tr21 is not broken by current concentration, and set to be Vinhibit<2×VDD. The voltage Vinhibit is preferably is set at a value which does not make the node Q2 in a floating state. Furthermore, the voltage Vinhibit is preferably set at a value which makes the voltage applied to the pass transistor less than 10 MV/cm in order to prevent the breakdown of the pass transistor PT2. Since the write voltage Vprg is applied to the gate of the memory element MT22, the voltage Vinhibit for preventing short circuit is applied to the source, and the drain is in a floating state, the memory element MT22 is not short-circuited. The gate voltage Von is applied to the control line CL1 for turning on the logic transistor Tr12. Although the gate of the pass transistor PT1 is connected to the node Q1 via the logic transistor Tr12, breakdown of the gate insulating film of the pass transistor PT1 does not occur since the ground voltage GND is applied to the node Q1. Since the voltage Vinhibit for preventing short-circuit is applied to the bit line BL2, a voltage of (Vinhibit−Vth) is applied to the node Q2, where Vth is a threshold voltage of the logic transistor T21. Since the voltage is also dropped by the threshold voltage Vth of the logic transistor Tr22, a voltage of about Vinhibit−2Vth is applied to the gate of the pass transistor PT2. This would not break the gate insulating film of the pass transistor PT2. Furthermore, in order to prevent the breakdown of the memory element MT22, the electric field to be applied to the memory element MT22 is preferably set to be less than 10 MV/cm.

The word line WL3 and the word line WL4 are brought into a floating state, and a gate voltage Voff (for example 0V), by which the logic transistors Tr13, Tr14 are brought into an OFF state, is applied to the source line SL2 and the control line CL2. Therefore, the memory elements MT13, MT14, MT23, MT24 are not short-circuited. Voltages applied to the word lines WL1, WL2, WL3, WL4, the source lines SL1, SL2, the control lines CL1, CL2, and the bit lines BL1, BL2 in the selective write method are controlled by the control circuit 100.

In the above example, the selective writing is performed on the memory element MT12 of the memory cell $10_1$. The selective writing can also be performed on the memory elements of the other memory cells. Data can be selectively written to each memory cell in this manner.

(Read Method)

Figure 6:
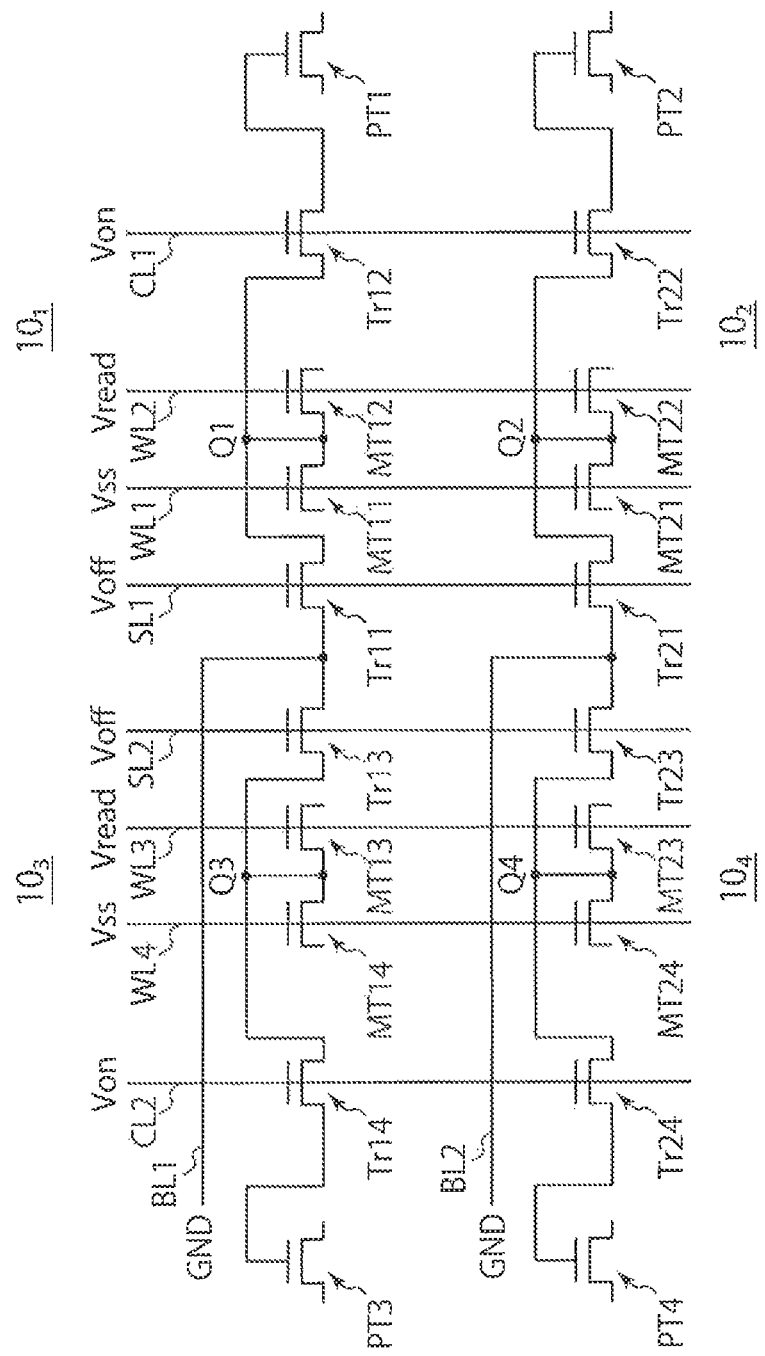
FIG. 6 is an explanatory diagram illustrating an example of reading method in the nonvolatile programmable logic switch shown in FIG. 4.

A method of reading data in the logic switch shown in FIG. 4 will be described with reference to FIG. 6. FIG. 6 is an explanatory diagram of an example of read method when the memory element MT12 is selectively short-circuited by applying voltages in the manner shown in FIG. 5. An voltage Voff for turning off the logic transistors Tr11, Tr13, Tr21, Tr23 is applied to the source lines SL1, SL2. Either the source or the drain of each of the logic transistors Tr11, Tr13, Tr21, Tr23 is connected to the bit line BL1. A read voltage Vread (for example, power supply voltage) is applied to one of the word lines WL1, WL2, and a voltage Vss (for example, ground voltage) is applied to the other. As a result, either the read voltage Vread or the voltage Vss is applied to the gate of the pass transistor PT1 through the path between the gate and the source of one of the memory elements MT11, MT12 in which the breakdown occurs. Voltages applied to the word lines WL1, WL2, WL3, WL4, the source lines SL1, SL2, the control lines CL1, CL2, and the bit lines BL1, BL2 in the read method are controlled by the control circuit 100.

In the above example, data is read from the memory cell $10_1$. However, data can be read from the other memory cells in the same manner. Data written in each memory cell can be read in this manner.

As described above, one switch information item can be stored in and read from a memory cell including two memory elements MT1, MT2 and two logic transistors in the first embodiment. If a plurality of such memory cells are connected in parallel so as to share word lines WL, source lines SL, and control lines CL, and further share pass transistors, a plurality of circuit information items can be dynamically switched. Furthermore, a large-scale circuit can be formed with a relatively small number of logics by employing the aforementioned structure.

Second Embodiment

Figure 7:
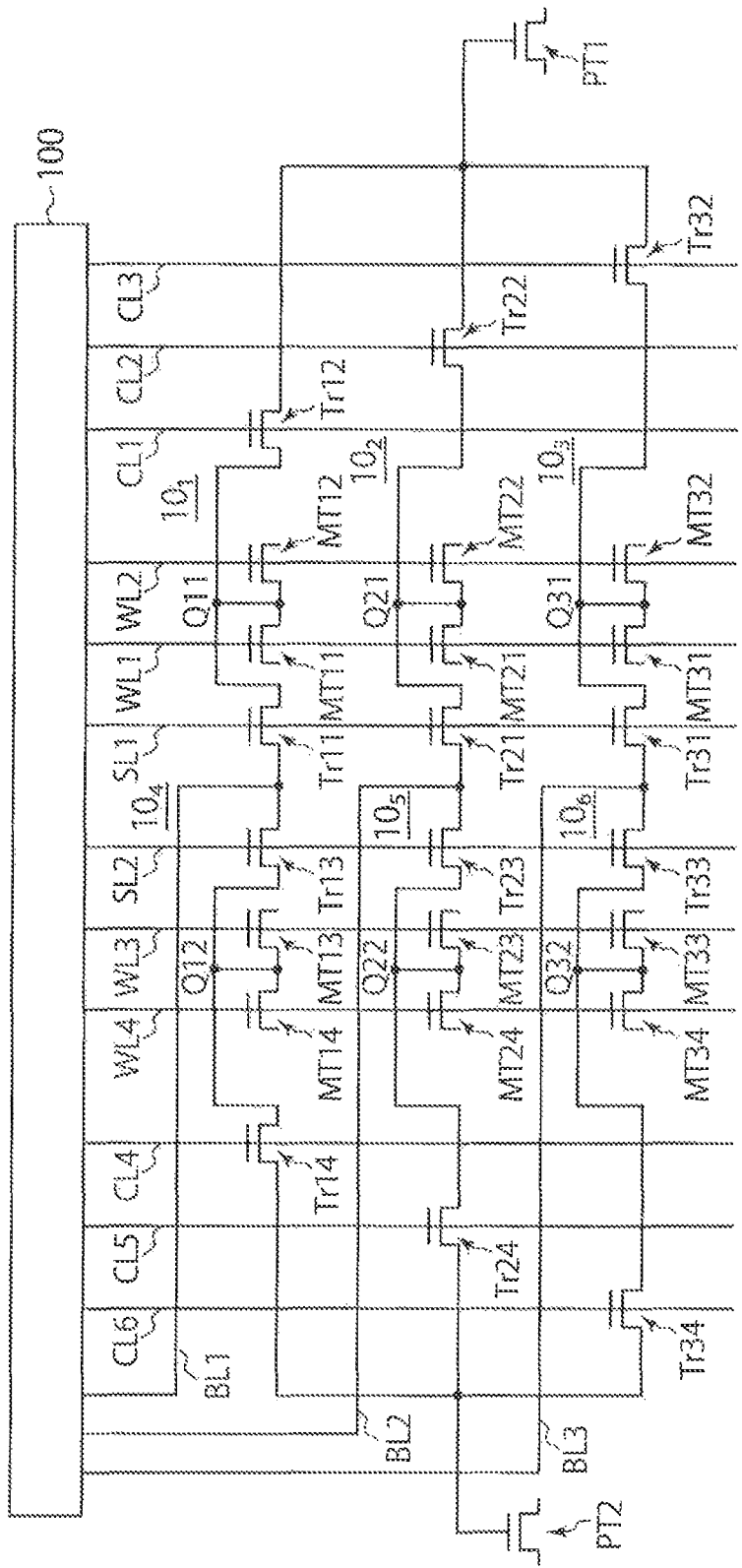
FIG. 7 is a circuit diagram showing a nonvolatile programmable logic switch according to a second embodiment.

A logic switch according to a second embodiment will be described with reference to FIG. 7. FIG. 7 is a circuit diagram showing the logic switch of the second embodiment. The logic switch according to the second embodiment is a multi-context logic switch including six memory cells $10_1$, $10_2$, $10_3$, $10_4$, $10_5$, $10_6$ arranged in an array form, two pass transistors PT1, PT2, and a control circuit 100. Each memory cell has a structure shown in FIG. 1. The memory cells $10_1$, $10_2$, $10_3$ share a common pass transistor PT1, and the memory cells $10_4$, $10_5$, $10_6$ share a common pass transistor PT2. The respective gates of the logic transistors on the pass transistor side of the memory cells $10_1$, $10_2$, $10_3$ are connected to different control lines, and the respective gates of the logic transistors on the pass transistor side of the memory cells $10_4$, $10_5$, $10_6$ are connected to different control lines.

Specifically, the memory cell $10_1$ includes two memory elements MT11, MT12 and two logic transistors Tr11, Tr12. One of the source and the drain of each of the memory elements MT11, MT12 is connected to a node Q11, and the gate is connected to one of word lines WL1, WL2. One of the source and the drain of the logic transistor Tr11 is connected to the node Q11, the other is connected to a bit line BL1, and the gate is connected to a source line SL1. One of the source and the drain of the logic transistor Tr12 is connected to the node Q11, the other is connected to the gate of the pass transistor PT1, and the gate is connected to a control line CL1.

The memory cell $10_2$ includes two memory elements MT21, MT22 and two logic transistors Tr21, Tr22. One of the source and the drain of each of the memory elements MT21, MT22 is connected to a node Q21, and the gate is connected to one of the word lines WL1, WL2. One of the source and the drain of the logic transistor Tr21 is connected to the node Q21, the other is connected to a bit line BL2, and the gate is connected to the source line SL1. One of the source and the drain of the logic transistor Tr22 is connected to the node Q21, the other is connected to the gate of the pass transistor PT1, and the gate is connected a control line CL2.

The memory cell $10_3$ includes two memory elements MT31, MT32 and two logic transistors Tr31, Tr32. One of the source and the drain of each of the memory elements MT31, MT32 is connected to a node Q31, and the gate is connected to one the word lines WL1, WL2. One of the source and the drain of the logic transistor Tr31 is connected to the node Q31, the other is connected to a bit line BL3, and the gate is connected to the source line SL1. One of the source and the drain of the logic transistor Tr32 is connected to the node Q31, the other is connected to the gate of the pass transistor PT1, and the gate is connected to a control line CL3.

The memory cell $10_4$ includes two memory elements MT13, MT14, and two logic transistors Tr13, Tr14. The source and the drain of each of the memory elements MT13, MT14 is connected to a node Q12, and the gate is connected to one of word lines WL3, WL4. One of the source and the drain of the logic transistor Tr13 is connected to the node Q12, the other is connected to the bit line BL1, and the gate is connected to a source line SL2. One of the source and the drain of the logic transistor Tr14 is connected to the node Q12, the other is connected to the gate of the pass transistor PT2, and the gate is connected to a control line CL4.

The memory cell $10_5$ includes two memory elements MT23, MT24 and two logic transistors Tr23, Tr24. One of the source and the drain of each of the memory elements MT23, MT24 is connected to a node Q22, and the gate is connected to one of the word lines WL3, WL4. One of the source and the drain of the logic transistor Tr23 is connected to the node Q22, the other is connected to the bit line BL2, and the gate is connected to the source line SL2. One of the source and the drain of the logic transistor Tr24 is connected to the node Q22, the other is connected to the gate of the pass transistor PT2, and the gate is connected to a control line CL5.

The memory cell $10_6$ includes two memory elements MT33, MT34 and two logic transistors Tr33, Tr34. One of the source and the drain of each of the memory elements MT33, MT34 is connected to a node Q32, and the gate is connected to one of the word lines WL3, WL4. One of the source and the drain of the logic transistor Tr33 is connected to the node Q32, the other is connected to the bit line BL3, and the gate is connected to the source line SL2. One of the source and the drain of the logic transistor Tr34 is connected to the node Q32, the other is connected to the gate of the pass transistor PT2, and the gate is connected to a control line CL6.

In the logic switch of the second embodiment thus constituted, the bit lines BL1, BL2, BL3 are each shared by different memory cells in the same context.

(Write Method)

Figure 8:
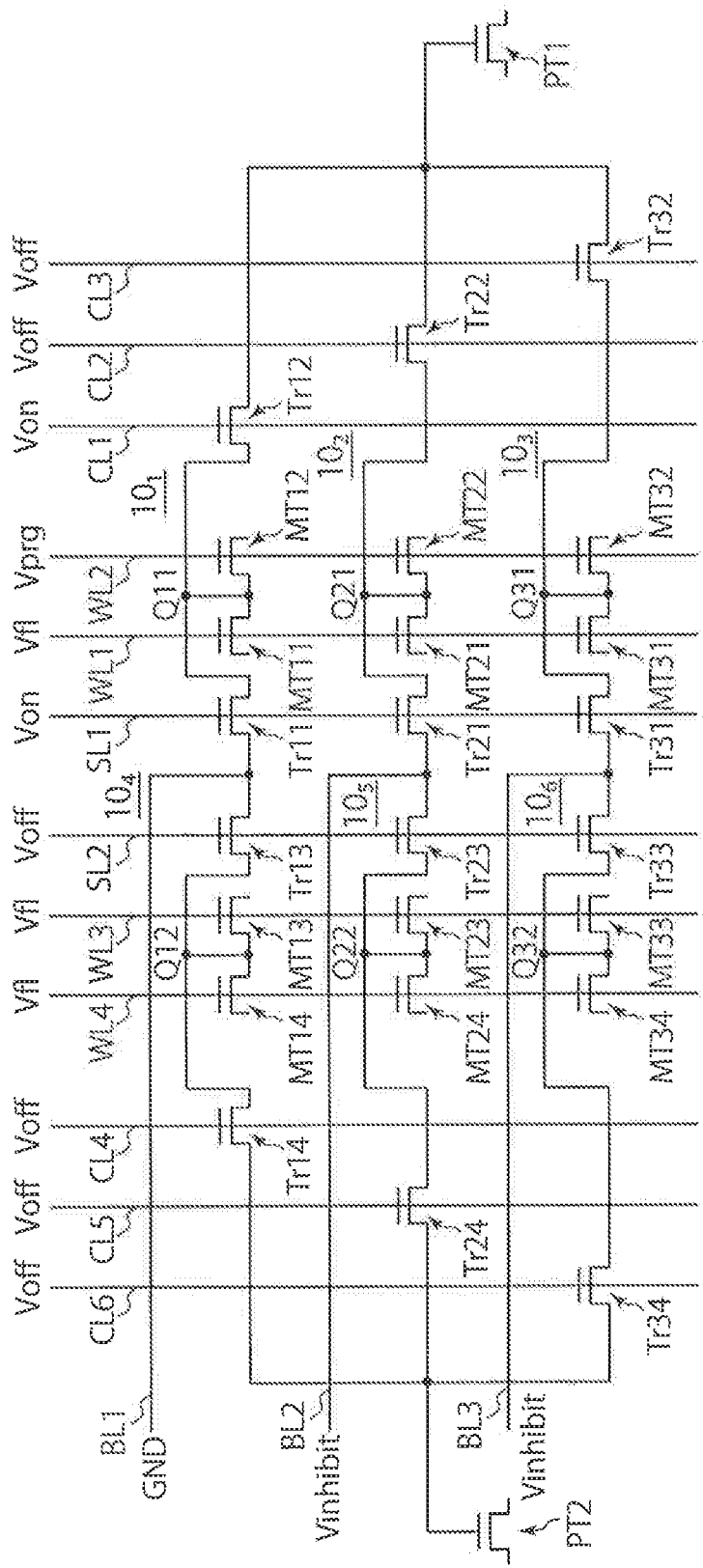
FIG. 8 is an explanatory diagram illustrating an example of selective writing method in the nonvolatile programmable logic switch shown in FIG. 7.

A method of selectively writing data to a memory cell in the logic switch according to the second embodiment shown in FIG. 7 will be described below with reference to FIG. 8. FIG. 8 is an explanatory diagram illustrating an example of voltage application conditions for selectively short-circuiting the memory element MT12 of the memory cell $10_1$ to write data to the memory element MT12. The word line WL1 is brought into a floating state, and a write voltage Vprg is applied to the word line WL2. A ground voltage GND is applied to the bit line BL1, and a voltage Von is applied to the source line SL1 for turning on the logic transistor Tr11. A voltage Vinhibit for preventing short circuit is applied to the bit line BL2 and the bit line BL3. The voltage Vinhibit has the same polarity as the write voltage Vprg, and is in a range 0<Vinhibit<Vprg. The write voltage Vprg is also applied to the gates of the memory element MT22 and the memory element MT32. However, the voltage Vinhibit is applied to one of the source and the drain of each of these memory elements, and the other is brought into a floating state. Accordingly, the memory element MT22 and the memory element MT32 are not short-circuited. The voltage Von is also applied to the control line CL1 for turning on the logic transistor Tr12. The gate of the pass transistor PT1 is connected to the node Q11 via the logic transistor Tr12. Thus, even if the logic transistor Tr12 is turned ON, the gate insulating film of the pass transistor PT1 is not broken since the voltage applied to the node Q11 is the ground voltage.

Since the voltage Vinhibit for preventing short circuit is applied to the bit line BL2 and the bit line BL3, a voltage of Vinhibit−Vth is applied to the node Q21 and the node Q31. However, since voltage is dropped by the threshold voltage of the logic transistor Tr22 and the logic transistor Tr32, a voltage of about Vinhibit−2Vth is applied to the gate of the pass transistor PT1. This would not break the gate insulating film of the pass transistor PT1.

The word line WL3 and the word line WL4 are brought into a floating state, and a voltage Voff (for example 0V) is applied to the source line SL2 and the control line CL2 to turn off the logic transistors Tr13, Tr14, Tr23, Tr24, Tr33, Tr34. Therefore, the memory elements MT13, MT14, MT23, MT24, MT33, MT34 are not short-circuited. Voltages applied to the word lines WL1, WL2, WL3, WL4, the source lines SL1, SL2, the control lines CL1 to CL6, and the bit lines BL1 to BL3 in the write method are controlled by the control circuit 100.

(Read Method)

Figure 9:
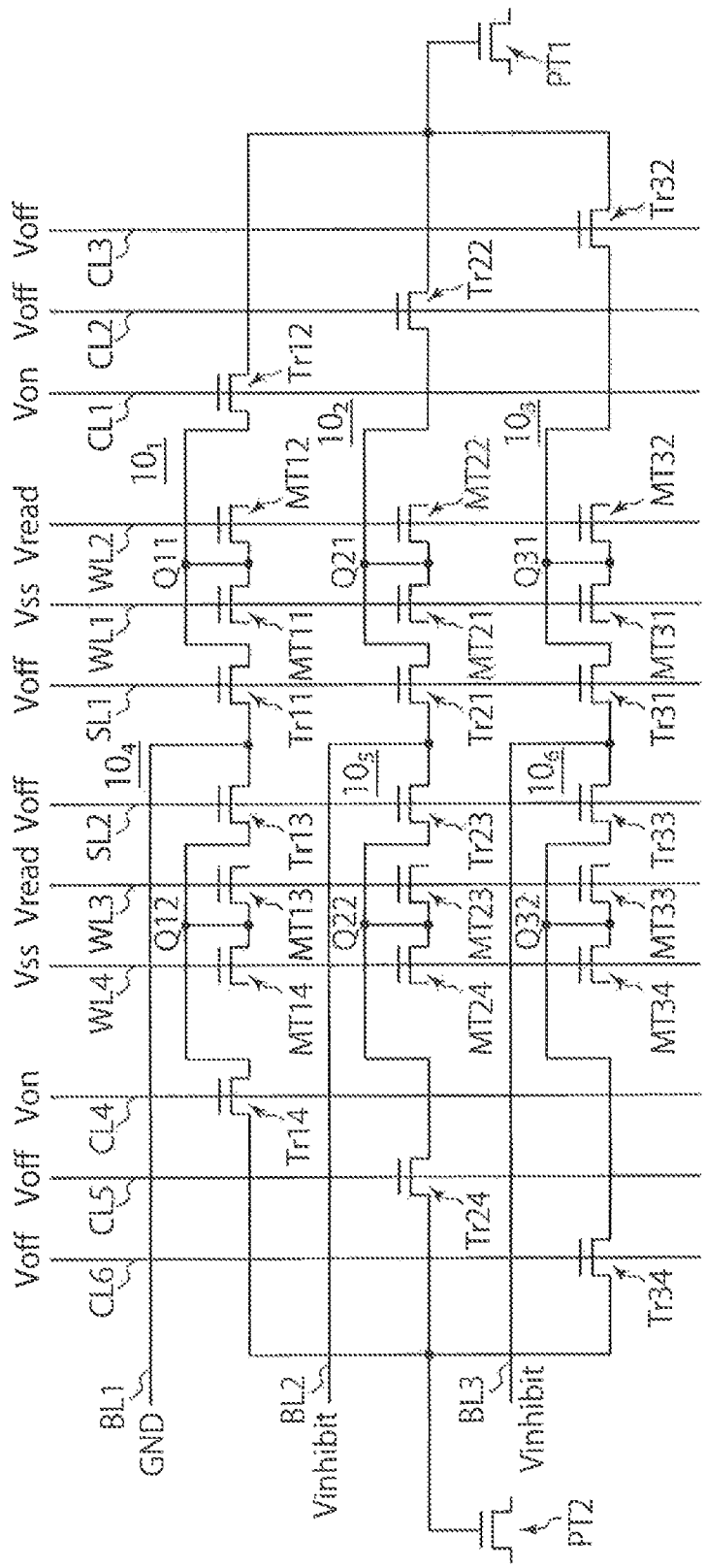
FIG. 9 is an explanatory diagram illustrating an example of reading method in the nonvolatile programmable logic switch shown in FIG. 7.

FIG. 9 is an explanatory diagram illustrating a read method in a case where a memory element is selectively short-circuited by voltage application shown in FIG. 8. A voltage Voff is applied to the source line SL1 and the source line SL2 for turning off the logic transistors Tr11, Tr13, Tr21, Tr23, Tr31, Tr33, in each of which one of the source and the drain is connected to the bit line BL. At the same time, a read voltage Vread (for example the power supply voltage) is applied to one of the word line WL1 and the word line WL2, and a voltage Vss (for example the ground voltage) is applied to the other. As a result, the read voltage or the ground voltage is applied to the gate of the pass transistor through a path between the gate and the source of one of the memory elements MT11, MT12, which is broken. A voltage Voff (for example the ground voltage) is applied to the control line CL2 and the control line CL3 to turn off the logic transistors Tr22, Tr32, which are connected to the gate of the pass transistor PT1, and included in the memory cells $10_2$, $10_3$ storing switching information of the context that is not read. Voltages applied to the word lines WL1, WL2, WL3, WL4, the source lines SL1, SL2, the control lines CL1 to CL6, and the bit lines BL1 to BL3 in the read method are controlled by the control circuit 100.

The logic transistors Tr12, Tr22, Tr32 are used to perform the switching in the aforementioned nonvolatile programmable logic switch having a plurality of switching information items, for example, by changing the connection from one of the memory cells $10_1$, $10_2$, $10_3$ connected to the pass transistor PT1 shown in FIG. 7 to another.

The semiconductor regions (for example, wells) on which the gates of the logic transistors Tr12, Tr22, Tr32 shown in FIG. 7 and these transistors themselves are formed are preferably independent of each other.

Figure 10:
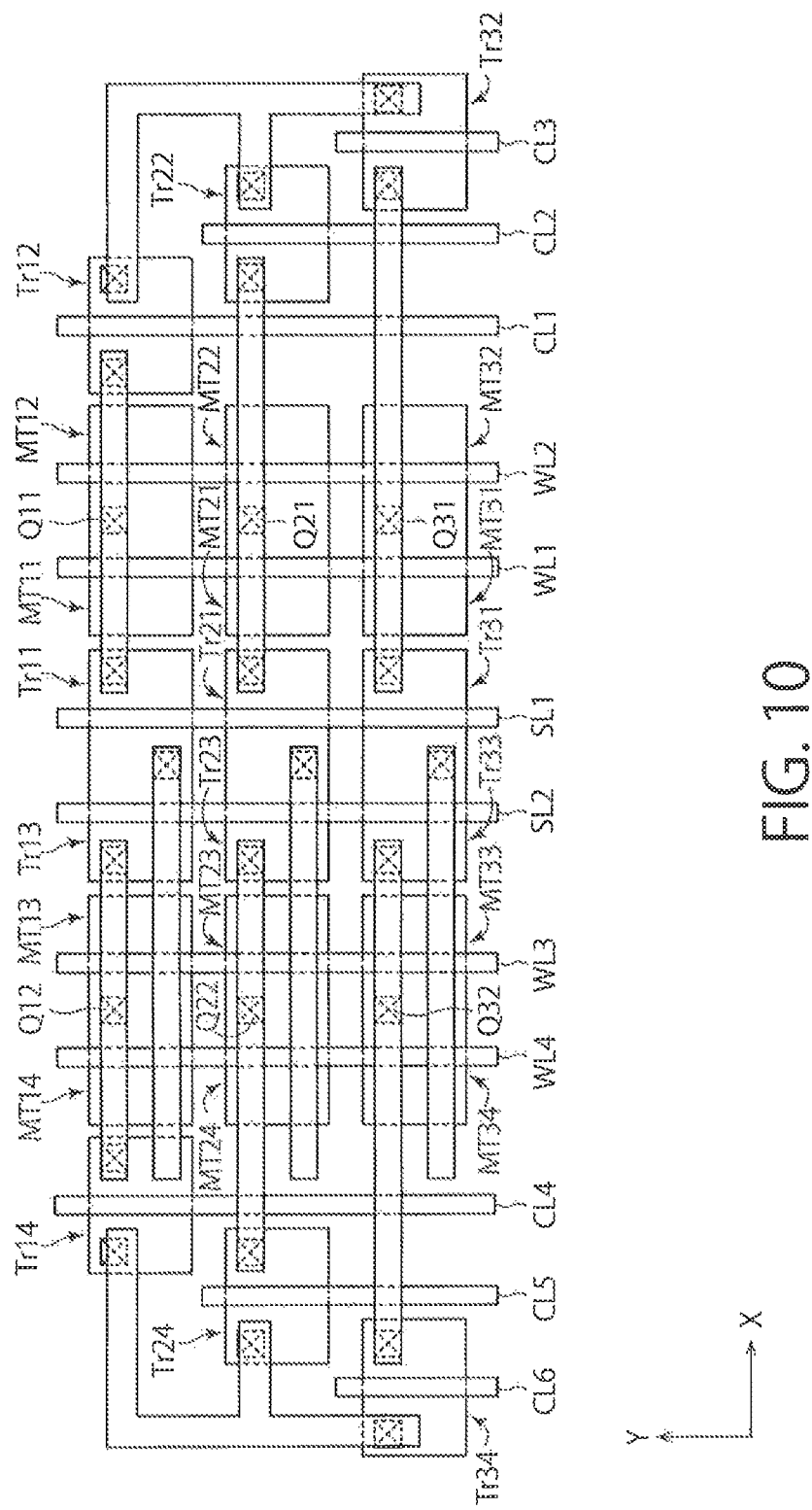
FIG. 10 is a diagram showing a first example of the layout of a memory cell portion of the nonvolatile programmable logic switch shown in FIG. 7.

FIG. 10 shows a first example of the layout of the nonvolatile programmable logic switch according to the second embodiment shown in FIG. 7. For the convenience of explanation, an x-y rectangular coordinate system is used. The gate lines WL1-WL4, SL1, SL2, and CL1-CL6 of the memory elements MT11-MT34 and the logic transistors Tr11-Tr34 shown in FIG. 7 extend in the y direction, and are shared by other memory cells arranged in the y direction. The logic transistors of memory cells adjacent to each other in the x direction, for example, the logic transistor Tr11 and the logic transistor Tr13, share the source electrode, and are formed on the same well. Similarly, the two memory elements in one memory cell, for example the memory element MT11 and the memory element MT12, share the source electrode, and are formed on the same well. Since one of the source and the drain of each of the memory elements MT11, MT12 is always in a floating state, it is not necessary to connect it to anywhere. The logic transistors serving as context switches, for example the logic transistors Tr12, Tr22, Tr32, are connected to the gate lines CL1, CL2, CL3 independently extending in the y direction.

Figure 11:
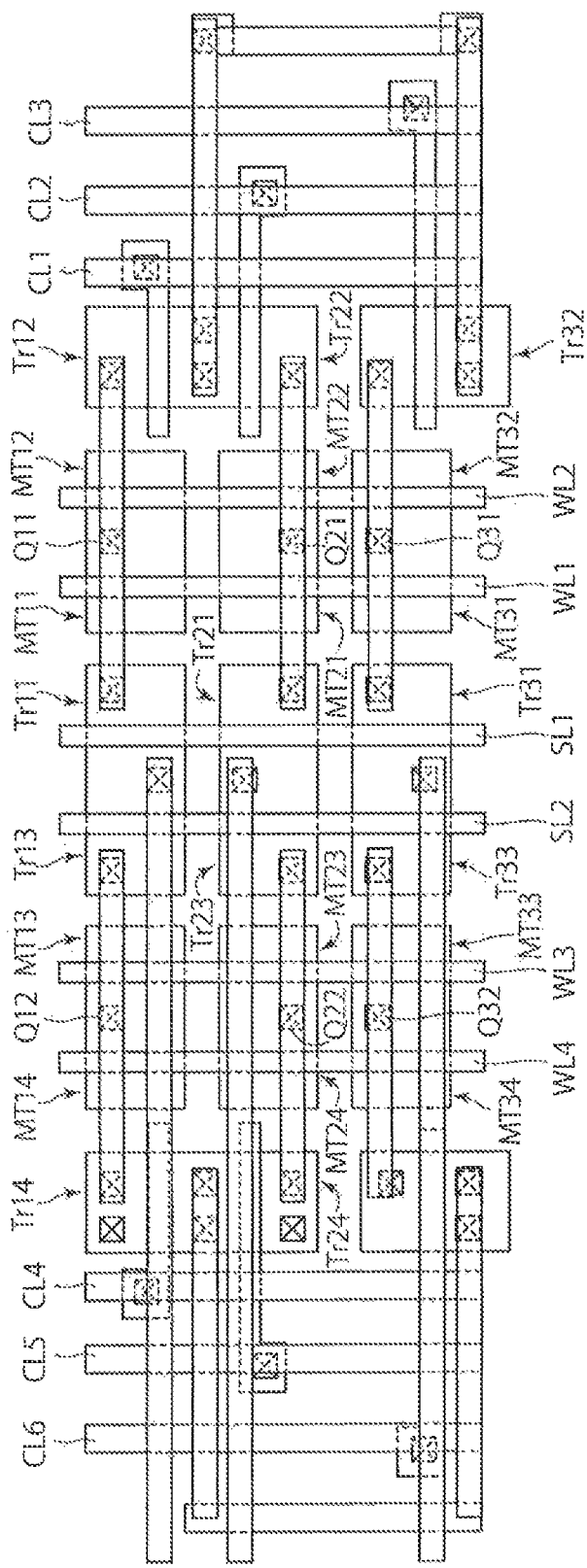
FIG. 11 is a diagram showing a second example of the layout of a memory cell portion of the nonvolatile programmable logic switch shown in FIG. 7.

FIG. 11 shows a second example of the layout of the nonvolatile programmable logic switch according to the second embodiment shown in FIG. 7. All of the gate lines connecting to the memory elements and the logic transistors shown in FIG. 7 extend in the y direction, and are shared by other memory cells arranged in the y direction. A gate electrode independently extending in the x direction is provided to each of logic transistors serving as a context switch, for example, the logic transistors Tr12, Tr22, Tr32. These logic transistors are connected to the other memory cells arranged in the y direction by wiring layers located above the gate electrodes. Since the gates of the logic transistors serving as context switches are arranged in a direction perpendicular to the gate lines of the other memory elements, the switching transistors of two memory cells adjacent to each other in the y direction, for example the logic transistor Tr12 and the logic transistor Tr22, can share the drain terminal. This is effective for reducing the layout area. The circuit for switching the context may be formed of another element such as a multiplexer.

As described above, the logic switch according to the second embodiment is capable of store one switching information item and read this item using a memory cell including two memory elements MT1, MT2 as in the case of the first embodiment. Furthermore, a plurality of circuit information items can be dynamically switched by arranging a plurality of such memory cells in parallel to share the word line WL, the source line SL, and the control line CL, and to share the pass transistor. Furthermore, by employing the aforementioned structure, a large-scale circuit can be formed with a relatively small number of logics.

In the first and the second embodiments described above, common MOS transistors, flash memories having a MONOS type gate structure, and transistors including high-k gate insulating films are listed as examples of the memory elements. Instead of such elements, programmable elements 14 as shown in FIGS. 12A to 12C may be used.

Figure 12A:
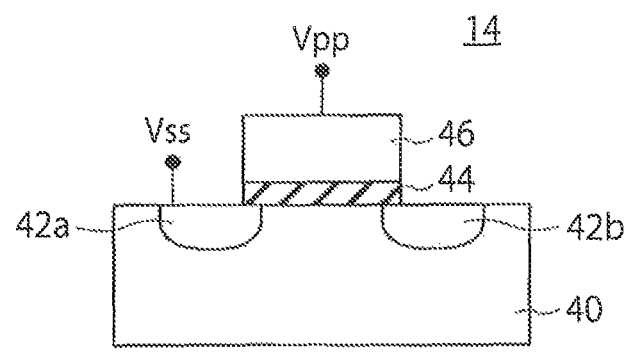
FIGS. 12A to 12C are cross-sectional views showing examples of memory element.
Figure 12B:
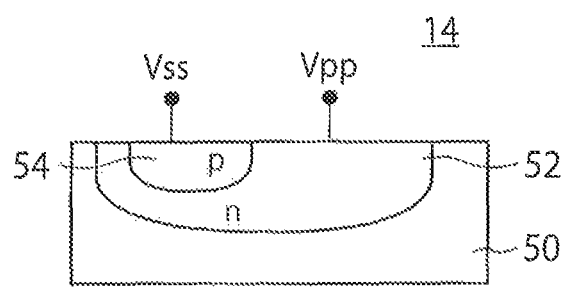
Figure 12C:
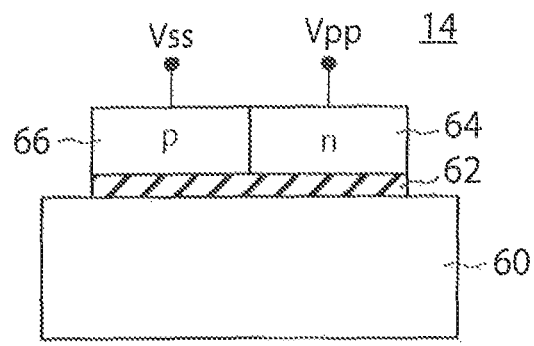

FIGS. 12A to 12C are cross-sectional views showing examples of the programmable element 14. FIG. 12A is a cross-sectional view showing a first example, in which a MOS transistor is employed as the programmable element 14, and a write operation is performed by breaking the gate insulating film of the MOS transistor. The programmable element 14 of the first example includes a source 42a and a drain 42b separately disposed in a semiconductor layer 40, a gate insulating film 44 formed on the semiconductor layer 40 between the source 42a and the drain 42b, a part of the gate insulating film 44 overlapping the source 42a and the drain 42b, and a gate 46 formed on the gate insulating film 44. A program voltage (write voltage) Vprg is applied to the gate 46, and a voltage Vss is applied to the source 42a to break the gate insulating film 44 in the region where the gate 46 overlaps the source 42a. The drain 42b has been brought into a floating state to break only the source terminal. The number of the wiring lines is the smallest in this case. This helps the circuit area to be reduced. Shallow trench isolation (STI) may be performed on the drain terminal that is not used.

The source 42a and the drain 42b may be electrically connected to each other so that the gate insulating film 44 is broken in at least one of the regions overlapping the source 42a and the drain 42b. As a result, the breakdown may occur at two portions, which improves the breakdown probability and shortens the wire time.

The source 42a, the drain 42b, and the semiconductor layer 40 may be electrically connected to each other. This increases the number of wiring lines, but considerably shortens the write time. The transistor may be either an n-channel MOS transistor or a p-channel MOS transistor. In the first and the second embodiments, signals pass through the broken conductive path. Therefore, in order to bring the gate 46 and the semiconductor layer 40 into conduction, the semiconductor layer 40 should be isolated so that the programmable element 14 is electrically separated from adjacent elements. Therefore, the terminals of the semiconductor layer 40 are preferably not conducted.

FIG. 12B is a cross-sectional view showing a second example of the programmable element 14 including a pn junction. A large reverse-bias voltage is applied to the pn junction to break the pn junction, thereby performing a write operation. The programmable element 14 of the second example includes an n well 52 formed in a semiconductor layer 50, and a p well 54 formed in the n well 52. A write voltage Vprg is applied to the n well 52, and a voltage Vss is applied to the p well 54.

FIG. 12C is a cross-sectional view of a third example of the programmable element 14 including a pn junction formed of polycrystalline silicon. A large reverse-bias voltage is applied to the pn junction to break the pn junction, thereby performing a write operation. In the programmable element 14 of the third example, an insulating film 62 is formed on a semiconductor layer 60, and an n layer 64 and a p layer 66 of polycrystalline silicon are formed on the insulating film 62. The n layer 64 and the p layer 66 can be formed by implanting an n-type impurity and a p-type impurity to the gate of polycrystalline silicon in the MOS transistor. The pn junction can be formed by preventing the formation of silicide at the junction region. After the pn junction is formed, a large reverse-bias voltage is applied to cause a breakdown. A pn junction formed of polycrystalline silicon may be smaller than a pn junction formed by forming a well in a semiconductor layer.

Figure 13:
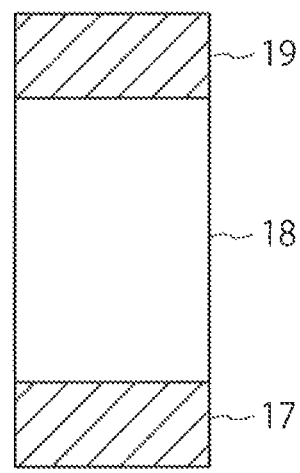
FIG. 13 is a cross-sectional view showing another example of memory element.

A resistance change memory device 14A shown in FIG. 13 may be employed as the memory element of the first and the second embodiments. The resistance change memory device 14A includes a lower electrode 17, and a resistance change film 18 stacked in this order. The resistance value of the resistance change film 18 can be changed to a high, a low, and an intermediate value depending on the magnitude, the direction, and the application time of the voltage applied between the upper electrode 19 and the lower electrode 17. Generally, a high voltage is applied to a resistance change film of a resistance change memory device to generate a defect (filament) therein in order to make a variable resistance insulating film. Assuming that the initial voltage (forming voltage) at this time is the write voltage Vprg, the operation to generate a defect is similar to the write operation to wire data to a memory element according to the first and the second embodiments. The resistance change memory device 14A used as a memory element becomes a nonvolatile memory element after defects are introduced thereto. Thus, data thereof can be repeatedly rewritten. This is an advantage of the device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile programmable logic switch comprising:
a memory cell; and
a pass transistor,
the memory cell including:
a nonvolatile first memory element including a first terminal connected to a first wiring line, and a second terminal;
a nonvolatile second memory element including a third terminal connected to a second wiring line, and a fourth terminal connected to the second terminal of the first memory element;
a first transistor, of which one of a source and a drain is connected to the second terminal and the fourth terminal, the other of the source and the drain is connected to a third wiring line, and a gate is connected to a fourth wiring line; and
a second transistor, of which one of a source and a drain is connected to the second terminal and the fourth terminal, the other of the source and the drain is connected to a gate of the pass transistor, and a gate is connected to a fifth wiring line.

2. The logic switch according to claim 1, wherein one of the first memory element and the second memory element is in a write state, and the other is in a no-write state.

3. The logic switch according to claim 1, further comprising a control circuit that controls voltages applied to the first to the fifth wiring lines.

4. The logic switch according to claim 1, wherein:
the first and second memory elements comprise first and second memory transistors respectively,
the first terminal of the first memory element is a gate of the first memory transistor, and the second terminal is one of a source and a drain of the first memory transistor, and
the third terminal of the second memory element is a gate of the second memory transistor, and the fourth terminal is one of a source and a drain of the second memory transistor.

5. The logic switch according to claim 4, further comprising a control circuit that controls voltages applied to the first to fifth wiring lines.

6. The logic switch according to claim 1, wherein the first memory element and the second memory element comprise a pn junction respectively.

7. A nonvolatile programmable logic switch comprising:
a first memory cell and a second memory cell; and
a first pass transistor and a second pass transistor corresponding to the first memory cell and the second memory cell respectively,
the first memory cell including:
a nonvolatile first memory element including a first terminal connected to a first wiring line, and a second terminal;
a nonvolatile second memory element including a third terminal connected to a second wiring line, and a fourth terminal connected to the second terminal of the first memory element;
a first transistor, of which one of a source and a drain is connected to the second terminal and the fourth terminal, the other is connected to a third wiring line, and a gate is connected to a fourth wiring line; and
a second transistor, of which one of a source and a drain is connected to the second terminal and the fourth terminal, the other is connected to a gate of the first pass transistor, and a gate is connected to a fifth wiring line,
the second memory cell including:
a nonvolatile third memory element including a fifth terminal connected to a sixth wiring line, and a sixth terminal;
a nonvolatile fourth memory element including a seventh terminal connected to a seventh wiring line, and an eighth terminal connected to the sixth terminal of the third memory element;
a third transistor, of which one of a source and a drain is connected to the sixth terminal and the eighth terminal, the other is connected to the third wiring line, and a gate is connected to an eighth wiring line; and
a fourth transistor, of which one of a source and a drain is connected to the sixth terminal and the eighth terminal, the other is connected to a gate of the second pass transistor, and a gate is connected to a ninth wiring line.

8. The logic switch according to claim 7, wherein:
one of the first memory element and the second memory element is in a write state, and the other is in a no-write state, and
one of the third memory element and the fourth memory element is in a write state, and the other is in a no-write state.

9. The logic switch according to claim 7, further comprising a control circuit that controls voltages applied to the first to the ninth wiring lines.

10. The logic switch according to claim 7, wherein:
the first to fourth memory elements comprise first to fourth memory transistors respectively;
the first terminal of the first memory element is a gate of the first memory transistor, and the second terminal is one of a source and a drain of the first memory transistor;
the third terminal of the second memory element is a gate of the second memory transistor, and the fourth terminal is one of a source and a drain of the second memory transistor;
the fifth terminal of the third memory element is a gate of the third memory transistor, and the sixth terminal is one of a source and a drain of the third memory transistor; and
the seventh terminal of the fourth memory element is a gate of the fourth memory transistor, and the eighth terminal is one of a source and a drain of the fourth memory transistor.

11. The logic switch according to claim 10, further comprising a control circuit that controls voltages applied to the first to ninth wiring lines.

12. The logic switch according to claim 7, wherein the first to fourth memory elements comprise a pn junction respectively.

13. A nonvolatile programmable logic switch comprising:
first to fourth memory cells; and
first and second pass transistors;
the first memory cell including:
a nonvolatile first memory element including a first terminal connected to a first wiring line, and a second terminal;
a nonvolatile second memory element including a third terminal connected to a second wiring line, and a fourth terminal connected to the second terminal of the first memory element;
a first transistor, of which one of a source and a drain is connected to the second terminal and the fourth terminal, the other is connected to a third wiring line, and a gate is connected to a fourth wiring line; and
a second transistor, of which one of a source and a drain is connected to the second terminal and the fourth terminal, the other is connected to a gate of the first pass transistor, and a gate is connected to a fifth wiring line,
the second memory cell including:
a nonvolatile third memory element including a fifth terminal connected to a sixth wiring line, and a sixth terminal;
a nonvolatile fourth memory element including a seventh terminal connected to a seventh wiring line, and an eighth terminal connected to the sixth terminal of the third memory element;
a third transistor, of which one of a source and a drain is connected to the sixth terminal and the eighth terminal, the other is connected to the third wiring line, and a gate is connected to an eighth wiring line; and
a fourth transistor, of which one of a source and a drain is connected to the sixth terminal and the eighth terminal, the other is connected to a gate of the second pass transistor, and a gate is connected to a ninth wiring line,
the third memory cell including:
a nonvolatile fifth memory element including a ninth terminal connected to the first wiring line, and a tenth terminal;
a nonvolatile sixth memory element including an eleventh terminal connected to the second wiring line, and a twelfth terminal connected to the tenth terminal of the fifth memory element;
a fifth transistor, of which one of a source and a drain is connected to the tenth terminal and the twelfth terminal, the other is connected to a tenth wiring line, and a gate is connected to the fourth wiring line; and
a sixth transistor, of which one of a source and a drain is connected to the tenth terminal and the twelfth terminal, the other is connected to the gate of the first pass transistor, and a gate is connected to an eleventh wiring line,
the fourth memory cell including:
a nonvolatile seventh memory element including a thirteenth terminal connected to the sixth wiring line, and a fourteenth terminal;
a nonvolatile eighth memory element including a fifteenth terminal connected to the seventh wiring line, and a sixteenth terminal connected to the fourteenth terminal of the seventh memory element;
a seventh transistor, of which one of a source and a drain is connected to the fourteenth terminal and the sixteenth terminal, the other is connected to the tenth wiring line, and a gate is connected to the eighth wiring line; and
an eighth transistor, of which one of a source and a drain is connected to the fourteenth terminal and the sixteenth terminal, the other is connected to the gate of the second pass transistor, and a gate is connected to a twelfth wiring line.

14. The logic switch according to claim 13, wherein:
one of the first memory element and the second memory element is in a write state, and the other is in a no-write state;
one of the third memory element and the fourth memory element is in a write state, and the other is in a no-write state;
one of the fifth memory element and the sixth memory element is in a write state, and the other is in a no-write state; and
one of the seventh memory element and the eighth memory element is in a write state, and the other is in a no-write state.

15. The logic switch according to claim 13, further comprising a control circuit that controls voltages applied to the first to twelfth wiring lines.

16. The logic switch according to claim 13, wherein:
the first to eighth memory elements comprise first to eighth memory transistors respectively;
the first terminal of the first memory element is a gate of the first memory transistor, and the second terminal is one of a source and a drain of the first memory transistor;
the third terminal of the second memory element is gate of the second memory transistor, and the fourth terminal is one of a source and a drain of the second memory transistor;
the fifth terminal of the third memory element is a gate of the third memory transistor, and the sixth terminal is one of a source and a drain of the third memory transistor;
the seventh terminal of the fourth memory element is a gate of the fourth memory transistor, and the eighth terminal is one of a source and a drain of the fourth memory transistor;
the ninth terminal of the of the fifth memory element is a gate of the fifth memory transistor, and the tenth terminal is one of a source and a drain of the fifth memory transistor;
the eleventh terminal of the sixth memory element is a gate of the sixth memory transistor, and the twelfth terminal is one of a source and a drain of the sixth memory transistor;
the thirteenth terminal of the seventh memory element is a gate of the seventh memory transistor, and the fourteenth terminal is one of a source and a drain of the seventh memory transistor; and
the fifteenth terminal of the eighth memory element is a gate of the eighth memory transistor, and the sixteenth terminal is one of a source and a drain of the eighth memory transistor.

17. The logic switch according to claim 16, further comprising a control circuit that controls voltages applied to the first to twelfth wiring lines.

18. The logic switch according to claim 13, wherein the first to eighth memory elements comprise a on junction respectively.

* * * * *